United States Patent
Cho

(10) Patent No.: US 7,375,557 B2
(45) Date of Patent: May 20, 2008

(54) PHASE-LOCKED LOOP AND METHOD THEREOF AND A PHASE-FREQUENCY DETECTOR AND METHOD THEREOF

(75) Inventor: Young-Kyun Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 47 days.

(21) Appl. No.: 11/314,087

(22) Filed: Dec. 22, 2005

(65) Prior Publication Data

US 2006/0214698 A1    Sep. 28, 2006

(30) Foreign Application Priority Data

Dec. 22, 2004   (KR) ..................... 10-2004-0110098

(51) Int. Cl.
  *G01R 25/00*   (2006.01)
  *H03D 13/00*   (2006.01)

(52) U.S. Cl. .............. 327/3; 327/5; 327/7; 327/12; 327/40; 327/49; 327/156; 327/159

(58) Field of Classification Search .............. 327/3, 327/7, 8, 12, 40, 43, 47, 49
See application file for complete search history.

(56) References Cited

U.S. PATENT DOCUMENTS 4,598,217 A * 7/1986 Predina et al. ................ 327/12
6,049,233 A   4/2000 Shurboff ........................ 327/2
6,157,218 A * 12/2000 Chen ............................. 327/7
6,323,692 B1 * 11/2001 Tsinker ....................... 327/12
6,483,389 B1 * 11/2002 Lamb ......................... 331/25
6,636,079 B2 * 10/2003 Koyama ....................... 327/7
7,003,065 B2 * 2/2006 Homol et al. ............. 375/376
2002/0021159 A1 * 2/2002 Takahashi .................. 327/283
2005/0219001 A1 * 10/2005 Booth .......................... 331/17

FOREIGN PATENT DOCUMENTS

JP    2001-230668    8/2001
KR   10-2004-0072263   8/2004

\* cited by examiner

*Primary Examiner*—Tuan T. Lam
*Assistant Examiner*—Patrick O'Neill
(74) *Attorney, Agent, or Firm*—Harness, Dickey & Pierce, P.L.C.

(57) ABSTRACT

The phase-frequency detector may include a first flip-flop configured to generate a first signal, the first signal transitioning to a first logic level in response to a first edge of a first input signal and transitioning to a second logic level in response to a delayed reset signal and a second flip-flop configured to generate a second signal, the second signal transitioning to the first logic level in response to a second edge of a second input signal and transitioning to the second logic level in response to the delayed reset signal. The phase-frequency detector may further include a first delay unit configured to delay a reset signal to generate the delayed reset signal and a second delay unit configured to delay the reset signal to generate an output control signal for adjusting at least one of the first and second signals.

32 Claims, 8 Drawing Sheets

PHASE-LOCKED LOOP AND METHOD THEREOF AND A PHASE-FREQUENCY DETECTOR AND METHOD THEREOF

PRIORITY STATEMENT

This application claims priority under 35 USC § 119 to Korean Patent Application No. 2004-110098, filed on Dec. 22, 2004, the contents of which are herein incorporated by reference in their entirety for all purposes.

BACKGROUND OF THE INVENTION

1. Field of the Invention

Example embodiments of the present invention relate generally to a phase-locked loop and method thereof and a phase-frequency detector and method thereof, and more particularly to a phase-locked loop and a phase-frequency detector with reduced performance errors and methods thereof.

2. Description of the Related Art

A phase-locked loop (PLL) and/or a delay-locked loop (DLL) may be employed in conventional digital communication systems to transmit data at higher speeds while maintaining a reliable data transfer. In the phase-locked loop, a phase-frequency detector may compare a phase of a reference signal with a phase of a signal received from a voltage-controlled oscillator (VCO). An output Of the phase-frequency detector may be applied to a charge pump to generate a phase detection signal varying in accordance with the phase difference between the reference signal and the VCO signal. A loop filter may perform a low pass filtering operation on the detected phase detection signal to generate a control voltage signal, which may be output to the VCO. The VCO may generate the VCO signal based on the control voltage signal received from the loop filter. The VCO signal may be divided by a loop divider and output to the phase-frequency detector to be compared with the reference signal.

FIG. 1 is a circuit diagram illustrating a conventional phase-frequency detector. Referring to FIG. 1, the conventional phase-frequency detector may include a first flip-flop 10, a second flip-flop 12 and an AND gate 14. The first flip-flop 10 may generate an up signal UP based upon a detection of a rising edge of the reference signal REF. The second flip-flop 12 may generate a down signal DN based upon a detection of a rising edge of a comparison signal FDB. The AND gate 14 may perform an AND operation of the up signal UP and the down signal DN to generate respective reset signals for the first and second flip-flops 10 and 12. The up signal UP may control an up current source of a charge pump 20 and the down signal DN may control a down current source of the charge pump 20.

A phenomenon referred to as a "dead zone" may occur during an operation of the conventional phase-frequency detector. If a phase difference between two input signals is low, the up signal UP may not reach a first logic level (e.g., a higher logic level or logic "1") due to the time required to charge a load capacitor of a switch (e.g., one or more of switches S1 and S2 which may be implemented as field effect transistors (FETs)) of the charge pump 20 (e.g., the up signal UP may not exceed a threshold voltage of the switch). Thus, the up signal UP and the down signal DN may instead be set to a second logic level (e.g., a low logic level or logic "0"). The dead zone may occur where the phase-frequency detector may not produce the up signal UP and the down signal DN for charging and discharging the charge pump despite the presence of a phase difference between the two input signals.

Occurrences of dead zones may be reduced by decreasing a rising time (e.g., a time period required to transition to the first logic level) of the up signal UP and the down signal DN output from the phase-frequency detector. As discussed above, the switches S1 and S2 of the charge pump 20 may be implemented as FETs, and reduction in capacitor loads associated with FETs may be difficult to achieve.

FIG. 2 is a graph illustrating a detected current based on a phase difference between two input signals received by the conventional phase-frequency detector in FIG. 1.

FIG. 3 is a circuit diagram illustrating another conventional phase-frequency detector. Referring to FIG. 3, another conventional phase-frequency detector may be configured similarly to the above-described phase-frequency of FIG. 1. However, this phase-frequency detector may further include a delay unit 16 for delaying a reset signal by the AND gate 14 for resetting the first and second flip-flops 10 and 12. Two input signals REF and FDB (e.g., a reference signal and a feedback signal, respectively) may be reset to the second logic level (e.g., a low logic level or logic "0") such that the up signal UP and the down signal DN may be maintained at the first logic level (e.g., a high logic level or logic "1") for a time period sufficient to reduce the dead zone.

FIG. 4 is a graph illustrating a detected current based on a phase difference between two input signals received by the conventional phase-frequency detector in FIG. 3.

Referring to FIG. 4, if both the up signal UP and the down signal DN are set to the first logic level (e.g., a high logic level or logic "1"), the switches S1 and S2 may each be turned on such that an "operating point" of the phase-frequency detector may move towards a centered position (e.g., see the directions indicated by the arrows illustrated in the graph of FIG. 4), which may thereby cause a glitch in the phase detection. If the delay added to the reset signal is increased (e.g., by the delay unit 16), a turn-on time of the switches S1 and S2 may likewise increase, which may thereby increase a frequency and/or duration of glitches.

Conventional phase-frequency detectors may be adapted to reduce pulse widths of the up signal UP and the down signal DN by controlling an output of the up signal UP and the down signal DN in response to the reset signal. However, if two input signals have substantially the same phases (e.g., where the phase difference may be close to zero), lower (e.g., minimum) pulse widths of the up signal UP and the down signal DN may be determined. Therefore, the dead zone may occur where the delay characteristics of the output gate are lower because the pulse widths of the up signal UP and the down signal DN may be set irrespective of the capacitance of the charge pump (e.g., charge pump 20). Further, as discussed above, adding delay (e.g., with the delay unit 16) to the output gate may reduce the dead zones at the expense of generating glitches or errors in the phase detection of the phase-frequency detector.

SUMMARY OF THE INVENTION

An example embodiment of the present invention is directed to a phase-frequency detector, including a first flip-flop configured to generate a first signal, the first signal transitioning to a first logic level in response to a first edge of a first input signal and transitioning to a second logic level in response to a delayed reset signal, a second flip-flop configured to generate a second signal, the second signal transitioning to the first logic level in response to a second edge of a second input signal and transitioning to the second logic level in response to the delayed reset signal, a first delay unit configured to delay a reset signal to generate the delayed reset signal and a second delay unit configured to delay the reset signal to generate an output control signal for adjusting at least one of the first and second signals.

Another example embodiment of the present invention is directed to a phase-locked loop, including a charge pump configured to generate a current signal having a current level varying based on a received set of first and second output signals and a phase-frequency detector configured to generate the first and second output signals, the first and second output signals transitioning to one of a first logic level and a second logic level based on a phase difference between a first input signal and a second input signal and at least one capacitor characteristic, the at least one capacitor characteristic compensating for at least one factor affecting operation of the charge pump.

Another example embodiment of the present invention is directed to a method of phase frequency detection, including generating a first signal, the first signal transitioning to a first logic level in response to a first edge of a first input signal and transitioning to a second logic level in response to a delayed reset signal, generating a second signal, the second signal transitioning to the first logic level in response to a second edge of a second input signal and transitioning to the second logic level in response to the delayed reset signal, first delaying a reset signal to generate the delayed reset signal and second delaying the reset signal to generate an output control signal for adjusting at least one of the first and second signals.

Another example embodiment of the present invention is directed to a method of phase detection, including generating a first output signal and a second output signal, the first and second output signals transitioning to one of a first logic level and a second logic level based on a phase difference between a first input signal and a second input signal and at least one capacitor characteristic, the at least one capacitor characteristic compensating for at least one factor affecting operation of a charge pump and generating a current signal having a current level varying based on the first and second output signals.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
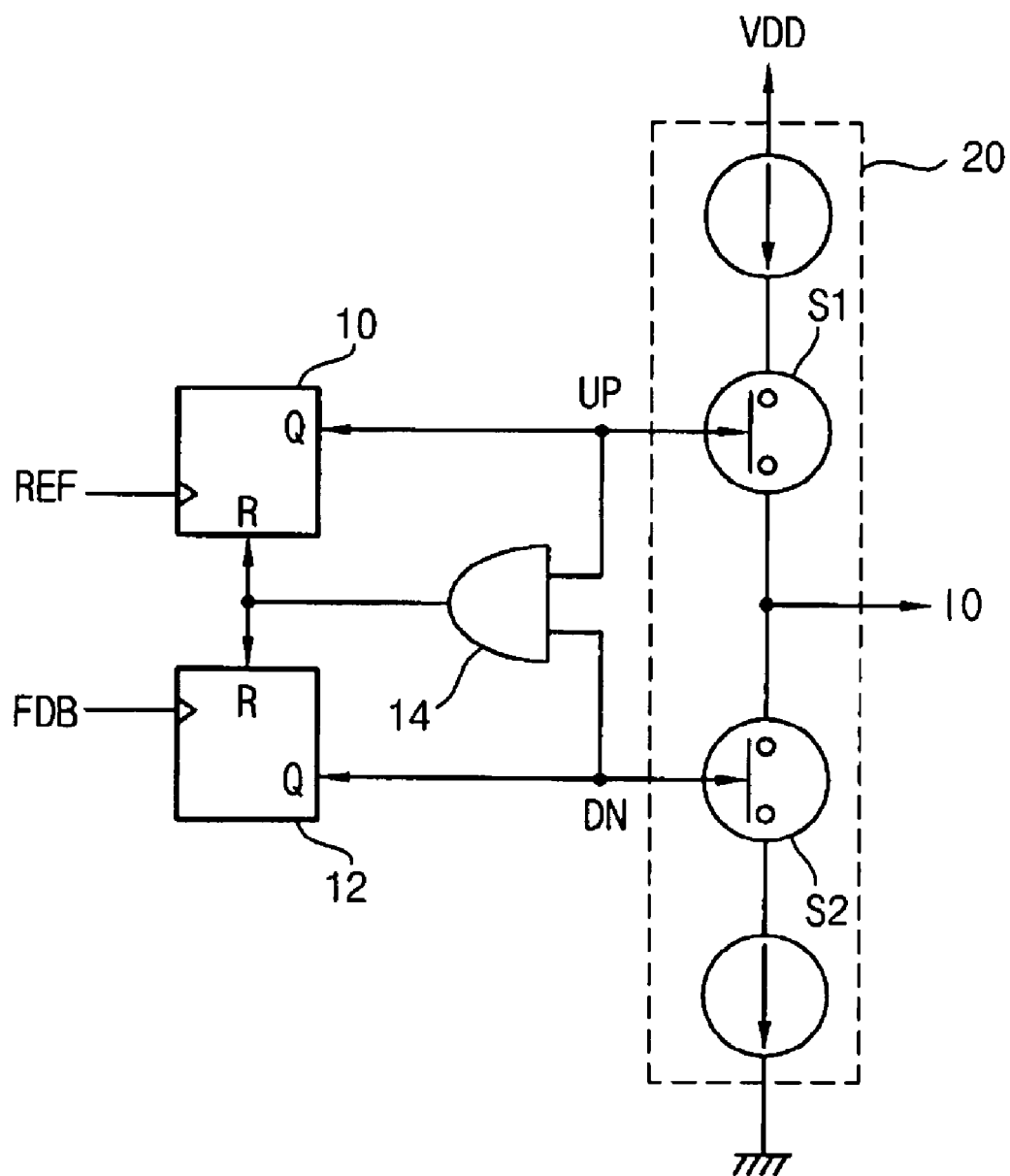
FIG. 1 is a circuit diagram illustrating a conventional phase-frequency detector.
Figure 2:
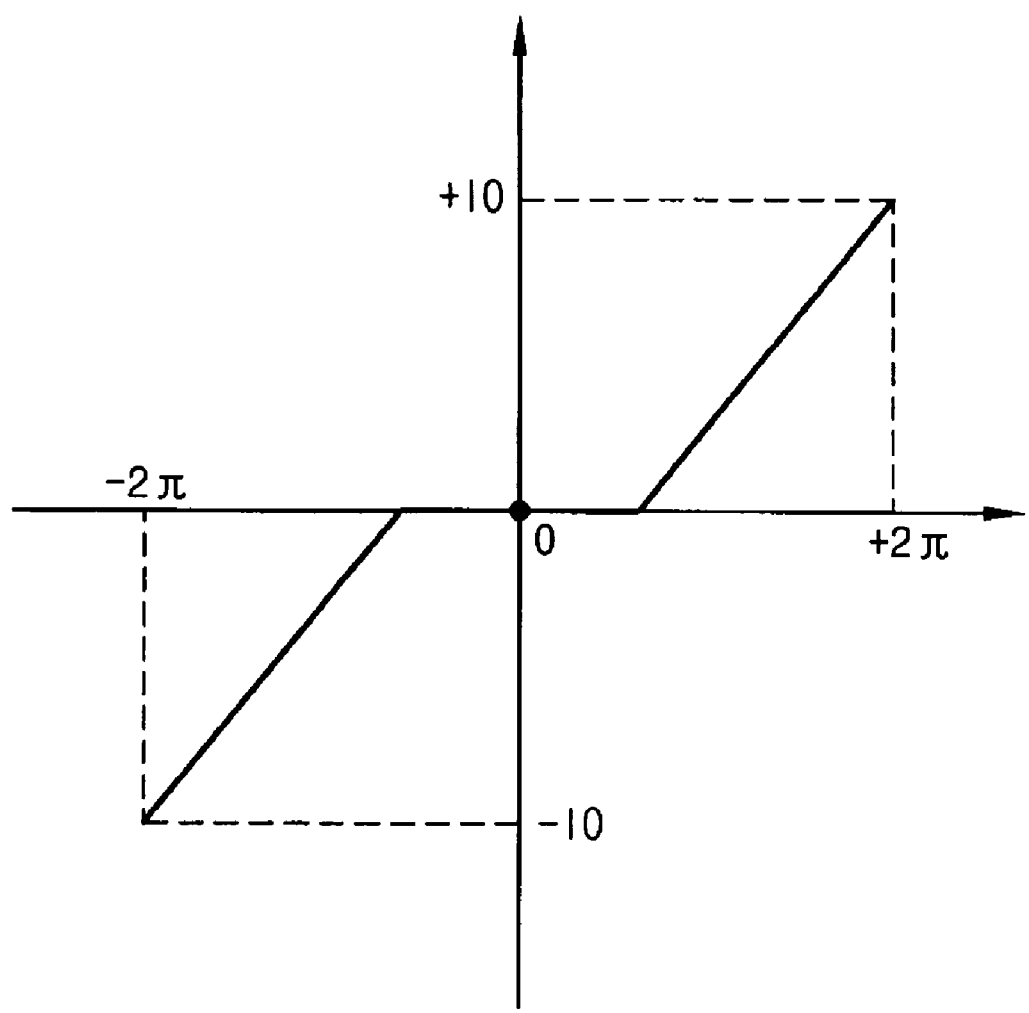
FIG. 2 is a graph illustrating a detected current based on a phase difference between two input signals received by the conventional phase-frequency detector of FIG. 1.
Figure 3:
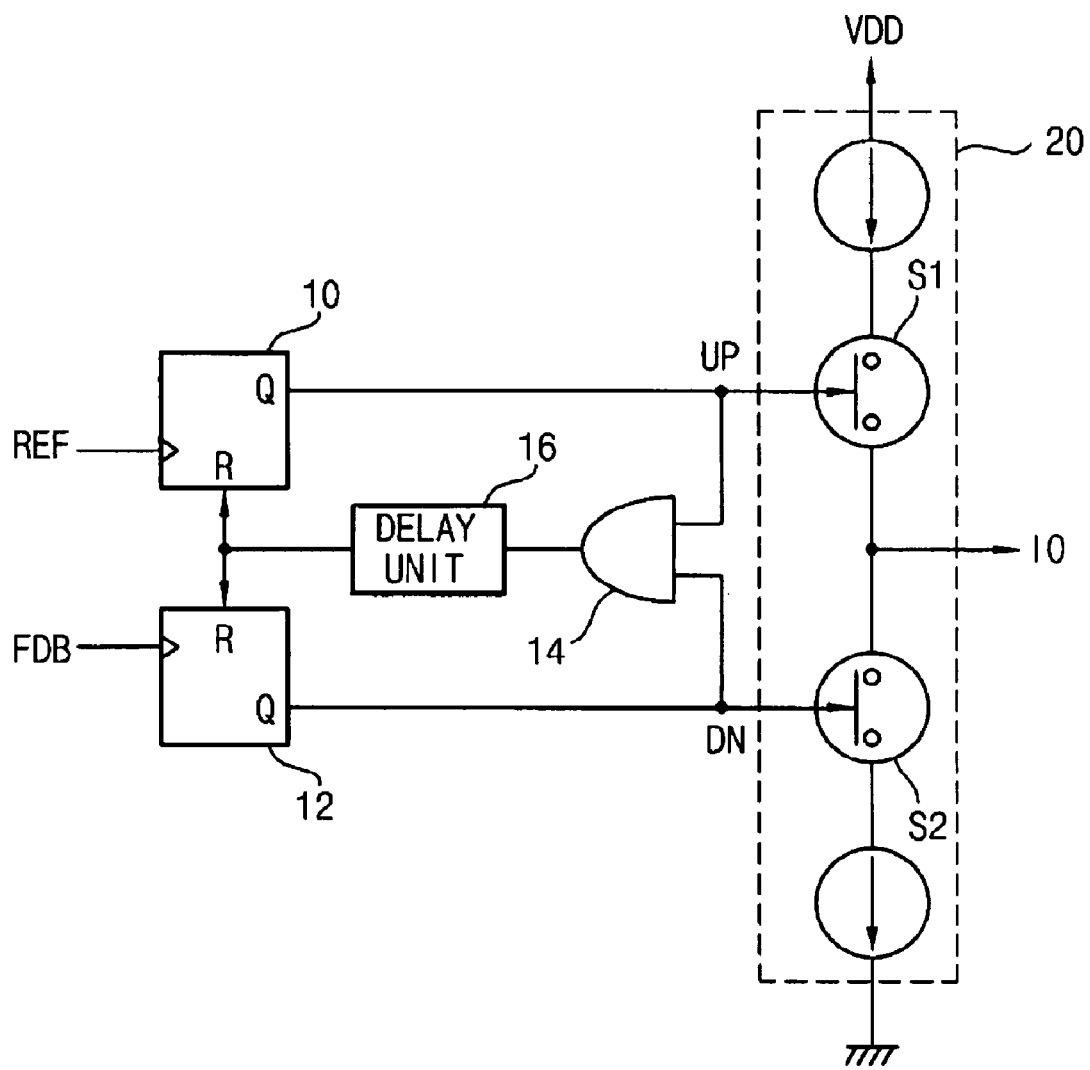
FIG. 3 is a circuit diagram illustrating another conventional phase-frequency detector.
Figure 4:
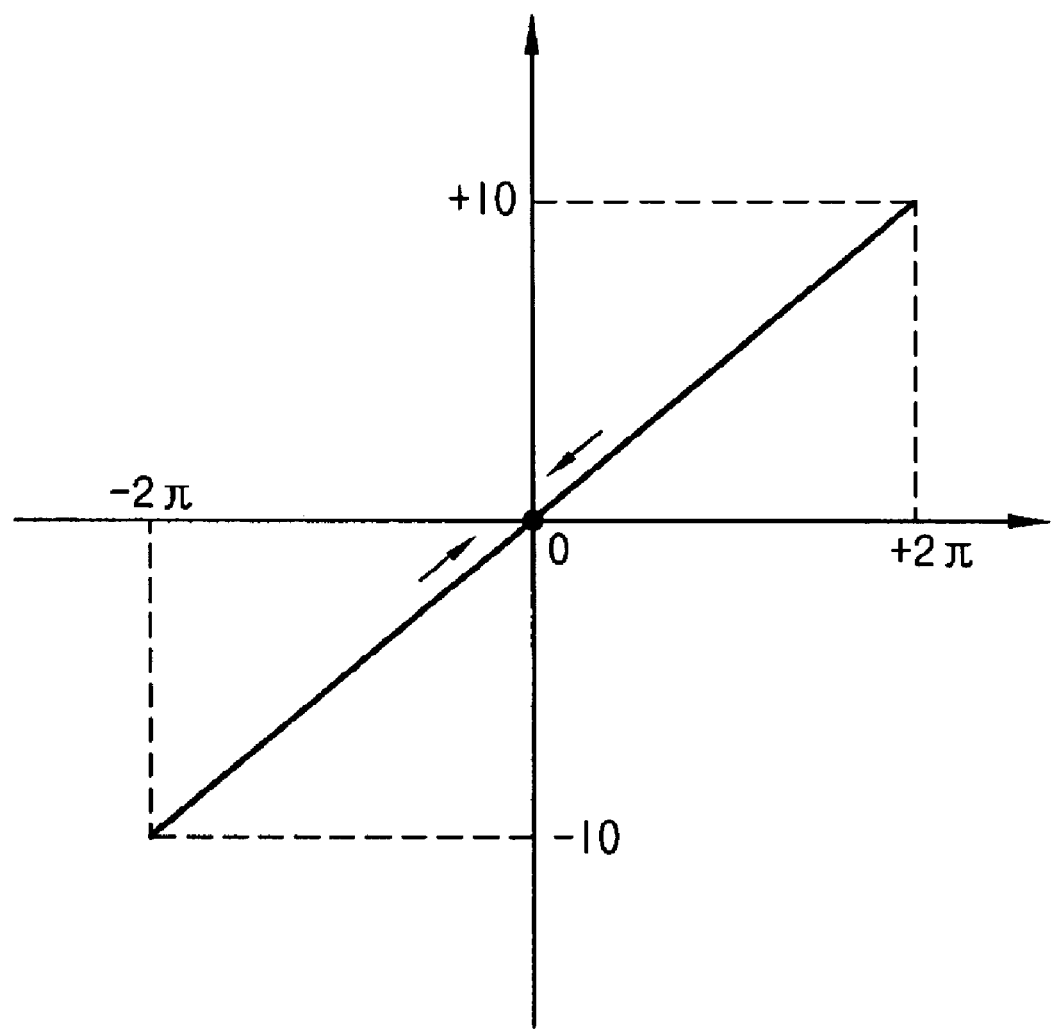
FIG. 4 is a graph illustrating a detected current based on a phase difference between two input signals received by the conventional phase-frequency detector of FIG. 3.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
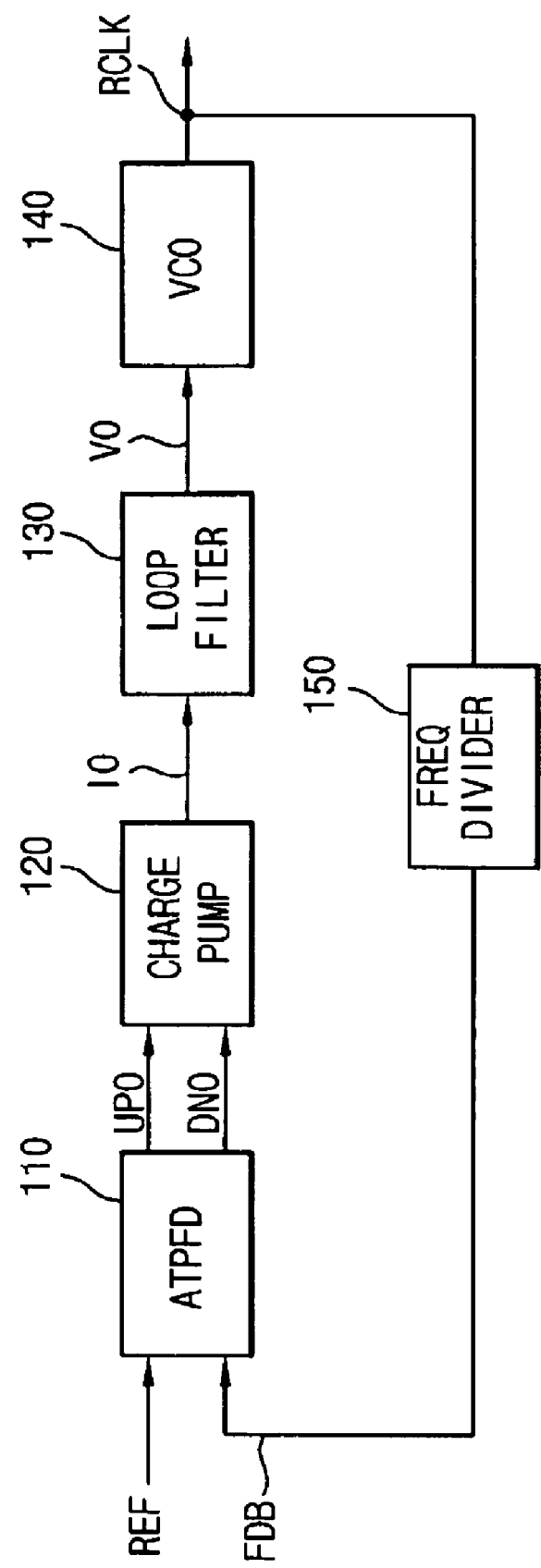
FIG. 5 is a block diagram illustrating a phase-locked loop (PLL) according to an example embodiment of the present invention.

FIG. 5 is a block diagram illustrating a phase-locked loop (PLL) according to an example embodiment of the present invention.

In the example embodiment of FIG. 5, the PLL may include an adaptive phase-frequency detector (ATPFD) 110, a charge pump 120, a loop filter 130, a voltage-controlled oscillator (VCO) 140 and a frequency divider 150.

In the example embodiment of FIG. 5, the ATPFD 110 may receive a reference signal REF and a feedback signal FBD. The ATPFD 110 may compare phases of the reference signal REF and the feedback signal FDB to generate signals UP0 and DN0 based on a detected phase difference. The charge pump 120 may generate a current signal IO based on the UP0 and DN0 signals. The loop filter 130 may perform a low-pass filtering operation on the current signal IO to generate a voltage signal VO and may output the voltage signal VO to the voltage-controlled oscillator 140 as a control signal. The voltage-controlled oscillator 140 may generate a recovered clock signal RCLK having a frequency based on a voltage level of the voltage signal VO. The frequency divider 150 may divide a frequency of the recovered clock signal RCLK with a given divide ratio to generate the feedback signal FDB. The feedback signal FDB may be output to the phase-frequency detector 110.

Figure 6:
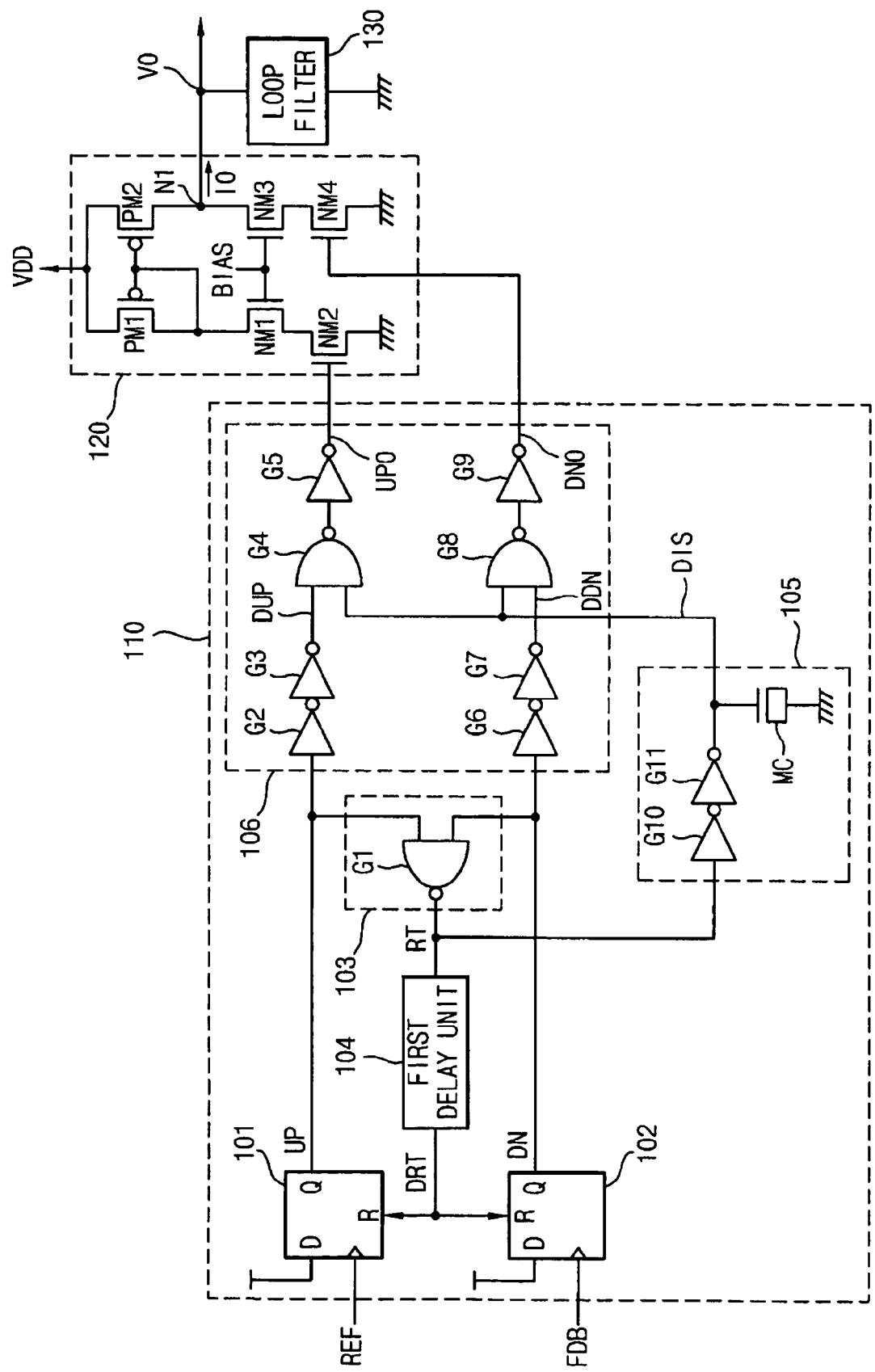
FIG. 6 is a circuit diagram illustrating an adaptive phase-frequency detector (ATPFD) and a charge pump according to an example embodiment of the present invention.

FIG. 6 is a circuit diagram illustrating the ATPFD 110 and the charge pump 120 of FIG. 5 according to an example embodiment of the present invention.

In the example embodiment of FIG. 6, the ATPFD 110 may include first and second flip-flops 101 and 102, a reset signal generator 103, a first delay unit 104, a second delay unit 105 and an output unit 106. The first flip-flop 101 may generate an up signal UP, which may transition to a first logic level (e.g., a high logic level or logic "1") in response to a leading edge of the reference signal REF. The second flip-flop 102 may generate a down signal DN, which may transition to the first logic level (e.g., a high logic level or logic "1") in response to a leading edge of the feedback signal FDB.

In the example embodiment of FIG. 6, the reset signal generator 103 may include a NAND gate G1 for performing a NAND operation on the up signal UP and the down signal DN to generate a reset signal RT. The first delay unit 104 may delay the reset signal RT by a given delay time to generate a delayed reset signal DRT. The second delay unit 105 may include inverters G10, G11 and a metal oxide semiconductor (MOS) capacitor MC to generate an output control signal DIS by delaying the reset signal RT. The inverters G10 and G11 may be serially coupled between an output terminal of the reset generator 103 and an input terminal of the output unit 106. The MOS capacitor MC may have a gate terminal coupled to the input terminal of the output unit 106 and source and drain terminals coupled to a ground voltage.

In the example embodiment of FIG. 6, the output unit 106 may include NAND gates G4 and G8 and inverters G2, G3, G5, G6, G7 and G9. The up signal UP may pass through the inverters G2 and G3 and may be transferred to a first input terminal of the NAND gate G4 as a delayed signal DUP. The down signal DN may pass through the inverters G6 and G7 and may be transferred to a first input terminal of the NAND gate G8 as a delayed signal DDN. The output control signal DIS may be applied to second input terminals of the NAND gate G4 and the NAND gate G8, respectively.

In the example embodiment of FIG. 6, an output of the NAND gate G4 may be received at the inverter G5 to provide the up output signal UP0 to the charge pump 120. An output of the NAND gate G8 may be received at the inverter G9 to provide the down output signal DN0 to the charge pump 120.

In the example embodiment of FIG. 6, the charge pump 120 may include PMOS transistors PM1 and PM2 and NMOS transistors NM1 through NM4. If the NMOS transistor NM2 is turned on, a reference current may flow through the NMOS transistors NM1 and NM2 via a bias voltage BIAS applied to the NMOS transistor NM1. The reference current flowing through the NMOS transistors NM1 and NM2 may be mirrored by the PMOS transistors PM1 and PM2, which forms a current mirror. The mirrored current is provided to an output node N1 as a pull up current.

In the example embodiment of FIG. 6, if the NMOS transistor NM4 is turned on, the reference current may flow through the NMOS transistors NM3 and NM4 via the bias voltage BIAS applied to the NMOS transistor NM3. The reference current flowing through the NMOS transistors NM3 and NM4 may be transferred to the output node N1 as a pull-down current. Therefore, an output current IO corresponding to a current difference between the pull-up current and the pull-down current may be generated. The output current IO may be filtered by the loop filter 130 to generate the control voltage VO. The control voltage VO may be transferred to the voltage-controlled oscillator 140 described above and illustrated in FIG. 5.

Figure 7:
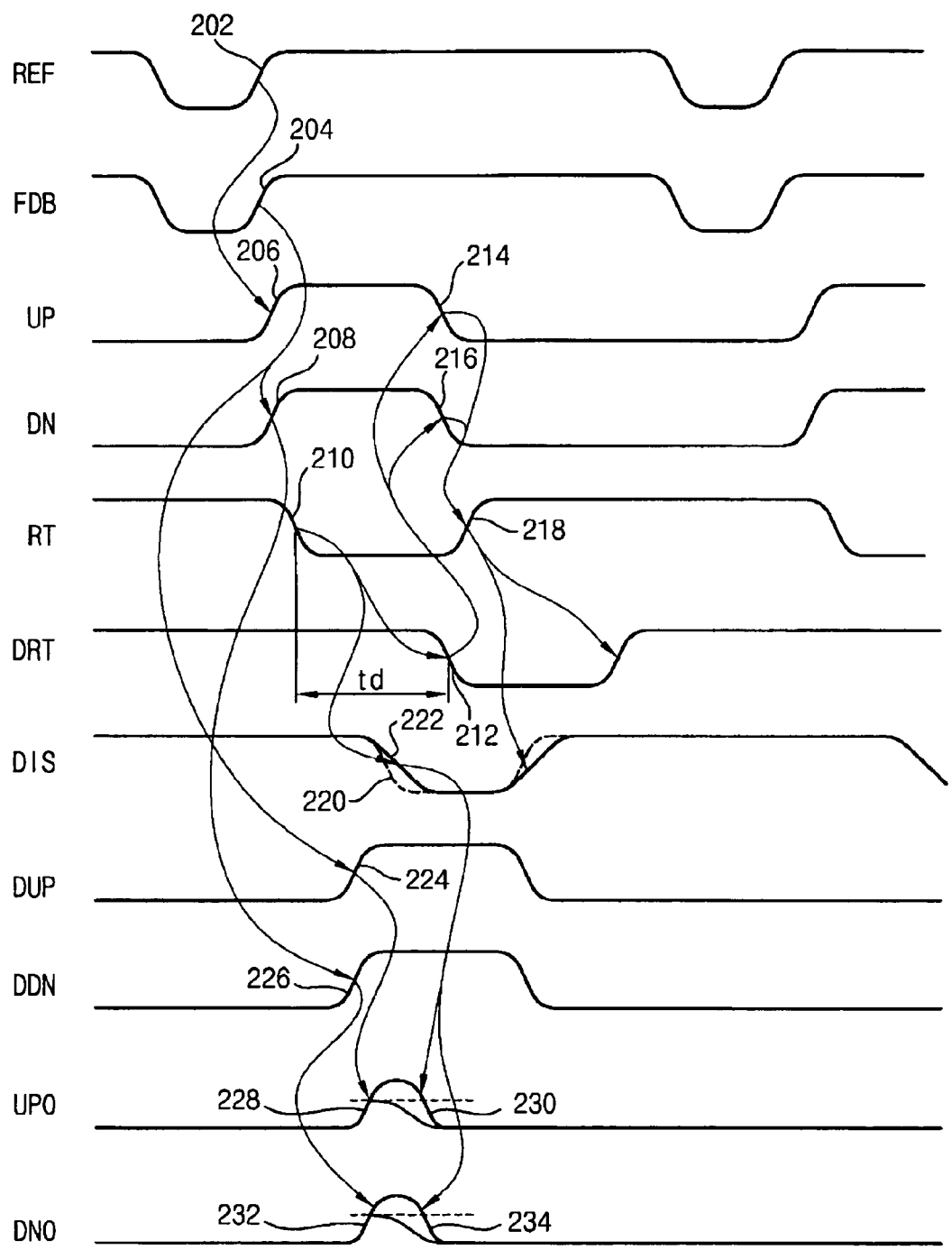
FIG. 7 is a waveform diagram illustrating signals associated with the ATPFD of FIG. 6.

FIG. 7 is a waveform diagram illustrating signals associated with the ATPFD 110 of FIG. 6. Further, FIG. 7 illustrates an example where the reference signal REF and the feedback signal FDB have substantially no phase difference.

As shown in FIG. 7, a leading edge 206 of the up signal UP may transition from the second logic level to the first logic level (e.g., may rise) edge in response to a rising edge 202 of the reference signal REF. A leading edge 208 of the down signal DN may transition from the second logic level to the first logic level in response to a rising edge 204 of the feedback signal FDB.

As shown in FIG. 7, and with reference to FIG. 6, the reset signal RT may have a leading edge 210 that may transition from the first logic level to the second logic level if the up signal UP and the down signal DN are each set to the first logic level. The reset signal RT may be delayed by a given delay time td to generate a delayed reset signal DRT for resetting the flip-flops 101 and 102. The trailing edges 214 and 216 of the up signal UP and the down signal DN, respectively, may thereby transition (e.g., may fall) to the second logic level (e.g., a low logic level or logic "0") in response to a leading edge 212 of the delayed reset signal DRT. The trailing edge 218 of the reset signal RT may transition to the first logic level (e.g., a high logic level or logic "1") in response to the trailing edges 214 and 216 of the up signal UP and the down signal DN, respectively.

In addition, the leading edge 210 of the reset signal RT may pass through the second delay unit 105 and may be delayed due to a capacitance of the MOS capacitor MC of the second delay unit 105. The output control signal DIS may thereby have a leading edge 220 which may gradually transition (e.g., at a lower transition rate) to die second logic level. Characteristics of the MOS capacitor, such as the capacitance of the MOS capacitor MC, may be affected by the same factors affecting characteristics (e.g., capacitance) of the MOS transistors (e.g., NMOS transistors NM2 and NM4) in the charge pump 120. For example, variations in the manufacturing process of the MOS transistors similarly affect the MOS capacitor MC because the MOS capacitor MC may be formed by the same process and/or along with the formation of the MOS transistors. Also, just as the power supply voltage and the operating environment characteristics (e.g., temperature) affect the MOS transistors so is the MOS capacitor MC affected. Accordingly, the output control signal DIS changes in accordance with those factors to adjust the delay time.

The up signal UP may pass through the inverters G2 and G3 and may be transferred to a first input terminal of the NAND gate G4 as a delayed signal DUP. The down signal DN may pass through the inverters G6 and G7 and may be transferred to a first input terminal of the NAND gate G8 as a delayed signal DDN.

A leading edge 228 of the up output signal UP0 may transition to the first logic level (e.g., a high logic level or logic "1") in response to a leading edge 224 of the delayed signal DUP. A trailing edge 230 of the up output signal UP0 may transition to the second logic level (e.g., a low logic level or logic "0") in response to a leading edge 220 of the output control signal DIS.

A leading edge 232 of the down output signal DN0 may transition to the first logic level (e.g., a high logic level or logic "1") in response to a leading edge 226 of the delayed signal DDN. A trailing edge 234 of the down output signal DN0 may transition to the second logic level (e.g., a low logic level or logic "0") in response to a leading edge 220 of the output control signal DIS. The up output signal UP0 and the down output signal DN0 may be applied to gates of the NMOS transistors NM2 and NM4, respectively, of the charge pump 120. In one example, if pulse widths of the two signals UP0 and DN0 are relatively narrow as compared with the capacitance of the NMOS transistors NM2 and NM4, a dead zone may occur in which the NMOS transistors NM2 and NM4 may not be turned on. In an alternative example, if the pulse widths of the two signals UP0 and DN0 are relatively wide as compared with the capacitance of the NMOS transistors NM2 and NM4, the turn-on times of the NMOS transistors NM2 and NM4 may be increased such that a glitch may occur. The NMOS transistors NM2 and NM4 (e.g., the capacitance thereof) are affected by a number of factors such as processing variations in the formation of the transistors, power supply voltage, and other environmental operating characteristics (e.g., temperature). Because these factors likewise affect the MOS capacitor MC, the output control signal DIS is affected and adjusts at least one of the up output signal UP0 and the down output signal DN0 such that possible negatives like dead zones and/or glitches are reduced and/or eliminated.

Figure 8:
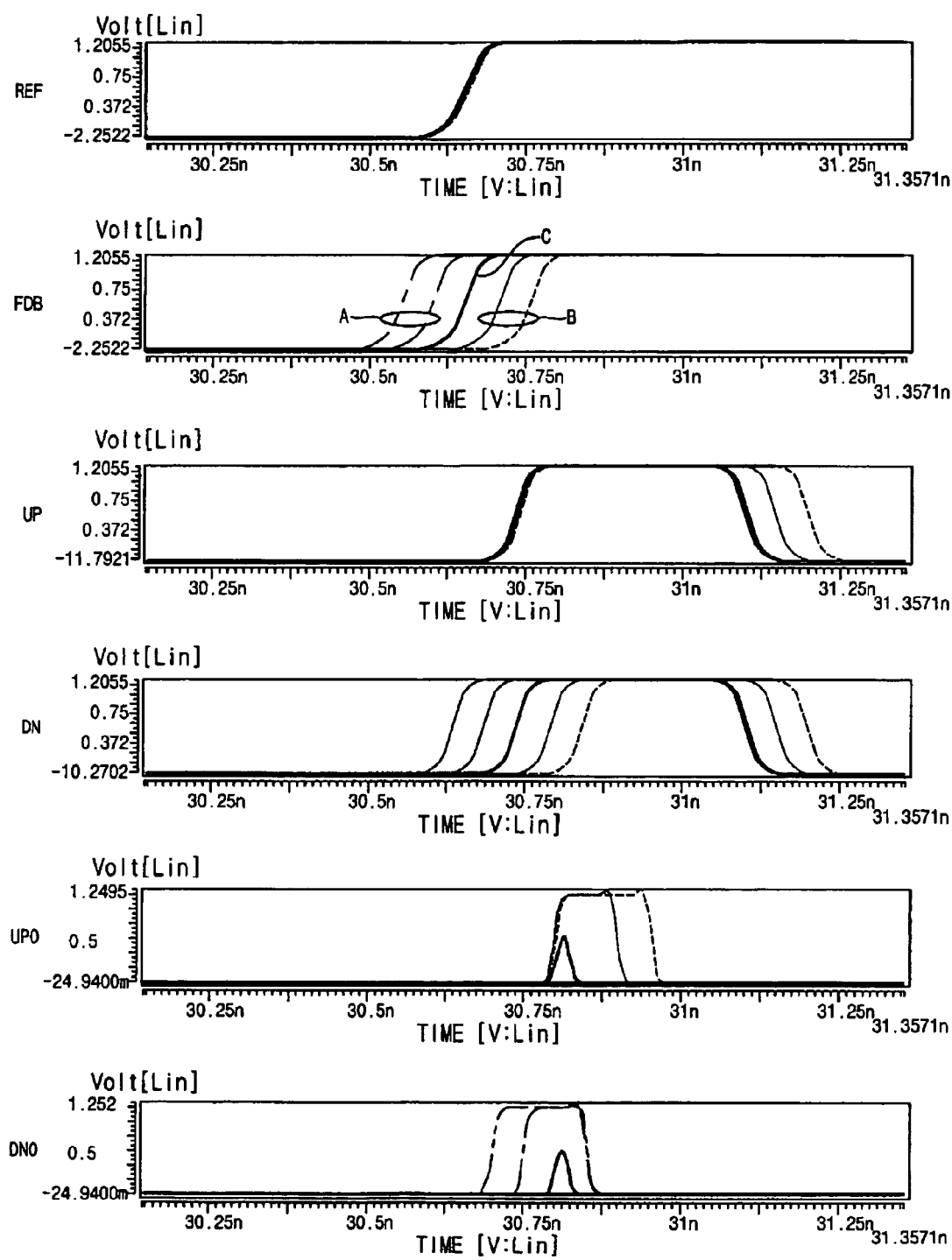
FIG. 8 illustrates simulation results of signals output by the ATPFD of FIGS. 5 and 6.

FIG. 8 illustrates simulation results of the UP0 signal and the DN0 signal output by the ATPFD 110 of FIGS. 5 and 6. The simulation results may be based on a number of measurements made at a given time interval approximating 50 picoseconds (ps). In FIG. 8, the phase of the reference signal REF may be fixed and the phase of the feedback signal FDB may be varied (e.g., at a frequency corresponding to the given time interval of 50 ps). As illustrated in FIG. 8, the phase difference between the reference signal REF and the feedback signal FDB may be, in chronological order with respect to the measurements made at consecutive time intervals, −100 ps, −50 ps, 0 ps, 50 ps and 100 ps.

In the example embodiment of FIG. 8, the up signal UP and the down signal DN may maintain lower (e.g., minimum) pulse widths if a phase difference between the reference signal REF and the feedback signal FDB may approximate 0 ps (e.g., illustrated in FIG. 8 as a thick solid line).

If a phase of the feedback signal FDB lags behind a phase of the reference signal REF (e.g., see curves 'B' which may be illustrated as a thin solid line and a dotted line, respectively, in FIG. 8), the trailing edge of the UP0 signal may be shifted toward the trailing edge direction such that the pulse width of the UP0 signal may be extended based on the phase difference between the reference signal REF and the feedback signal FDB, while the DN0 signal may maintain the lower (e.g., minimum) pulse width. The thin solid line of the B curves of the feedback signal FDB may indicate that the phase of the feedback signal FDB lags behind a phase of the reference signal REF by 50 ps. The dotted line of the feedback signal FDB may indicate that the phase of the feedback signal FDB lags behind a phase of the reference signal REF by 100 ps.

If the phase of the feedback signal FDB is ahead of the phase of the reference signal REF (e.g., see curves 'A' which may be illustrated as a two-dotted line and a one-dotted line, respectively, in FIG. 8), the leading edge of the UP0 signal may be shifted toward the leading edge direction such that the pulse width of the DN0 signal may be extended based on the phase difference between the reference signal REF and the feedback signal FDB, while the UP0 signal may maintain the reduced (e.g., minimum) pulse width.

As described above, pulse widths of an up output signal and a down output signal may be output by a phase-frequency detector (e.g., ATPFD 110 of FIG. 5 and/or FIG. 6) to a charge pump (e.g., charge pump 120 of FIG. 5 and/or FIG. 6) in a phase-locked loop (PLL) (e.g., the PLL of FIG. 5). Because a capacitor in the ATPFD 110 has characteristics (e.g., capacitance) associated with the switch transistors (e.g., NMOS transistors, NM2 and NM4) at the charge pump 120, the up and down output signals may be adjusted so as to compensate for a capacitance of a switch transistor of the charge pump such that occurrences of dead zones and/or glitches may be reduced. Accordingly, jitter characteristics of the phase-locked loop (PLL) may be improved. In addition, an influence of variations in manufacturing processes, power supply voltages, operating environment temperatures, and/or other factors may be reduced and/or compensated.

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A phase-frequency detector, comprising:
a first flip-flop configured to generate a first signal, the first signal transitioning to a first logic level in response to a first edge of a first input signal and transitioning to a second logic level in response to a delayed reset signal;
a second flip-flop configured to generate a second signal, the second signal transitioning to the first logic level in response to a second edge of a second input signal and transitioning to the second logic level in response to the delayed reset signal;
a first delay unit configured to delay a reset signal to generate the delayed reset signal; and a second delay unit configured to delay the reset signal to generate an output control signal for adjusting at least one of the first and second signals;

an output unit configured to adjust at least one of the first and second signals based on the output control signal to generate first and second output signals, wherein the first output signal transitions to the first logic level in response to a leading edge of the first signal and transitions to the second logic level in response to the output control signal, and the second output signal transitions to the first logic level in response to a leading edge of the second signal and transitions to the second logic level in response to the output control signal.

2. The phase-frequency detector of claim 1, wherein the first logic level is a high logic level and the second logic level is a low logic level.

3. The phase-frequency detector of claim 1, wherein the first and second edges are leading edges of the first and second input signals, respectively.

4. The phase-frequency detector of claim 1, further comprising:
a reset signal generator configured to generate the reset signal based on the first and second signals.

5. The phase-frequency detector of claim 1, wherein the second delay unit includes a capacitor having at least one characteristic that varies in association with variation in at least one characteristic of at least one switching transistor in a charge pump associated with the phase-frequency detector.

6. The phase-frequency detector of claim 5, wherein the at least one characteristic of the capacitor varies based on at least one of variations in a manufacturing process for forming the at least one switching transistor, a power supply voltage for the phase-frequency detector and the charge pump, and an operating environment characteristic.

7. The phase-frequency detector of claim 6, wherein the operating environment characteristic is an operating environment temperature.

8. The phase-frequency detector of claim 5, wherein the at least one characteristic of the capacitor and the at least one switching transistor is capacitance.

9. The phase-frequency detector of claim 5, wherein the capacitor is a MOS capacitor and the at least one switching transistor is a MOS transistor.

10. The phase-frequency detector of claim 5, further comprising:
an output unit configured to adjust at least one of the first and second signals based on the output control signal to generate first and second charge pump input signals.

11. The phase-frequency detector of claim 1, wherein the output unit is configured to adjust at least one of the first and second signals such that at least one of dead zone occurrences and glitches are reduced.

12. The phase-frequency detector of claim 1, wherein the second delay unit includes
at least two inverters serially coupled between an output terminal of a reset signal generator and an input terminal of the output unit; and
a capacitor having a gate terminal coupled to the input terminal of the output unit and source and drain terminals coupled to a ground voltage.

13. A phase-locked loop, comprising:
a charge pump configured to generate a current signal having a current level varying based on a received set of first and second output signals; and
a phase-frequency detector configured to generate the first and second output signals, the first output signal transitions to a first logic level in response to a leading edge of a first input signal and transitions to a second logic level in response to an output control signal, and the second output signal transitions to the first logic level in response to a leading edge of a second input signal and transitions to the second logic level in response to the output control signal, the transitions of the first and the second output signals further based on a phase difference between the first input signal and the second input signal and at least one capacitor characteristic, the at least one capacitor characteristic compensating for at least one factor affecting operation of the charge pump, the at least one factor including a power supply voltage of the phase-frequency detector, at least one of a manufacturing process related to at least one transistor within the charge pump, and an operating environment characteristic.

14. The phase-locked loop of claim 13, wherein the first input signal is a reference signal and the second input signal is a feedback signal.

15. The phase-locked loop of claim 13, wherein the first logic level is a high logic level and the second logic level is a low logic level.

16. The phase-locked loop of claim 13, wherein the operating environment characteristic is an operating environment temperature.

17. The phase-locked loop of claim 13, further comprising:
a loop filter configured to perform a low-pass filtering operation on the current signal to generate a voltage signal; and
a voltage-controlled oscillator configured to generate at least one oscillation signal having a frequency varying based on a voltage level of the voltage signal.

18. The phase-locked loop of claim 17, further comprising:
a frequency divider configured to divide a frequency of the at least one oscillation signal to provide a frequency-divided oscillation signal to the phase-frequency detector as the second input signal.

19. The phase-locked loop of claim 18, wherein the at least one capacitor characteristic is provided by a MOS capacitor, a capacitance of the MOS capacitor varying based on the at least one factor, the at least one factor including at least one of variations in a manufacturing process for forming at least one switching transistor within the charge pump, a power supply voltage for the phase-frequency detector and the charge pump, and an operating environment characteristic.

20. The phase-locked loop of claim 19, wherein the operating environment characteristic is an operating environment temperature.

21. A method of phase frequency detection, comprising:
generating a first signal, the first signal transitioning to a first logic level in response to a first edge of a first input signal and transitioning to a second logic level in response to a delayed reset signal;
generating a second signal, the second signal transitioning to the first logic level in response to a second edge of a second input signal and transitioning to the second logic level in response to the delayed reset signal;
first delaying a reset signal to generate the delayed reset signal;
second delaying the reset signal to generate an output control signal for adjusting at least one of the first and second signals; and generating a first output signal and a second output signal based at least in part on the output control signal for performing a charge pumping operation, wherein the first output signal transitions to the first logic level in response to a leading edge of the first signal and transitions to the second logic level in response to the output control signal, and the second output signal transitions to the first logic level in response to a leading edge of the second signal and transitions to the second logic level in response to the output control signal.

22. The method of claim 21, wherein the first logic level is a high logic level, the second logic level is a low logic level, the first and second edges are leading edges of the first and second input signals, respectively, the first input signal is a reference signal and the second input signal is a feedback signal.

23. The method of claim 21, further comprising:
generating the reset signal based on the first and second signals.

24. The method of claim 21, wherein the second delaying step includes employing a capacitor having a capacitance that varies in association with a variation of at least one factor affecting operation of a charge pump.

25. The method of claim 24, wherein the at least one factor includes at least one of a manufacturing process related to at least one transistor within the charge pump, a power voltage of the phase-frequency detector and an operating environment characteristic.

26. The method of claim 25, wherein the operating environment characteristic is an operating environment temperature.

27. A phase-frequency detector for performing the method of claim 21.

28. A method of phase detection, comprising:
generating a first output signal and a second output signal, the first output signal transitioning to a first logic level in response to a leading edge of a first input signal and transitioning to a second logic level in response to an output control signal, and the second output signal transitioning to the first logic level in response to a leading edge of the second input signal and transitioning to the second logic level in response to the output control signal, the transitioning of the first output signal and the second output signal further based on a phase difference between the first input signal and the second input signal and at least one capacitor characteristic, the at least one capacitor characteristic compensating for at least one factor affecting operation of a charge pump, the at least one factor including a power supply voltage of the phase-frequency detector, at least one of a manufacturing process related to at least one transistor within the charge pump, and an operating environment characteristic; and
generating a current signal having a current level varying based on the first and second output signals.

29. The method of claim 28, wherein the first input signal is a reference signal, the second input signal is a feedback signal, the first logic level is a high logic level and the second logic level is a low logic level.

30. The method of claim 28, wherein the at least one capacitor characteristic varies in association with a variation of at least one switching transistor of the charge pump.

31. The method of claim 28, wherein the operating environment characteristic is an operating environment temperature.

32. A phase-locked loop performing the method of claim 28.

* * * * *